US 10,692,789 B2

(12) United States Patent
Liu et al.

(10) Patent No.: US 10,692,789 B2
(45) Date of Patent: Jun. 23, 2020

(54) STACKED FAN-OUT PACKAGE STRUCTURE

(71) Applicant: MediaTek Inc., Hsin-Chu (TW)

(72) Inventors: Nai-Wei Liu, Kaohsiung (TW); Tzu-Hung Lin, Zhubei (TW); I-Hsuan Peng, Hsinchu (TW); Ching-Wen Hsiao, Hsinchu (TW); Wei-Che Huang, Zhudong Township, Hsinchu County (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/968,449

(22) Filed: May 1, 2018

(65) Prior Publication Data

US 2018/0323127 A1 Nov. 8, 2018

Related U.S. Application Data

(63) Continuation of application No. 15/218,379, filed on Jul. 25, 2016, now abandoned.
(Continued)

(51) Int. Cl.
*H01L 23/31* (2006.01)
*H01L 23/538* (2006.01)
(Continued)

(52) U.S. Cl.
CPC .... *H01L 23/3114* (2013.01); *H01L 23/49811* (2013.01); *H01L 23/5389* (2013.01);
(Continued)

(58) Field of Classification Search
CPC ........... H01L 23/3114; H01L 23/49811; H01L 24/94; H01L 24/19; H01L 24/20;
(Continued)

(56) References Cited

U.S. PATENT DOCUMENTS 7,550,857 B1 * 6/2009 Longo ..................... H01L 24/19
257/686
2007/0096289 A1 * 5/2007 Enomoto ............ H01L 23/5389
257/687
(Continued)

FOREIGN PATENT DOCUMENTS

| CN | 104051395 A | 9/2014 |
|---|---|---|
| EP | 1455392 A1 | 9/2004 |
| WO | WO 2009/009436 A2 | 1/2009 |

OTHER PUBLICATIONS

Extended European Search Report for Application No. EP 16186728.8 dated Jun. 12, 2017.

*Primary Examiner* — Bitew A Dinke
(74) *Attorney, Agent, or Firm* — Wolf, Greenfield & Sacks, P.C.

(57) ABSTRACT

A semiconductor package structure is provided. The structure includes a first semiconductor die having a first surface and a second surface opposite thereto. A first molding compound surrounds the first semiconductor die. A first redistribution layer (RDL) structure is disposed on the second surface of the first semiconductor die and laterally extends on the first molding compound. A second semiconductor die is disposed on the first RDL structure and has a first surface and a second surface opposite thereto. A second molding compound surrounds the second semiconductor die. A first protective layer covers a sidewall of the first RDL structure and a sidewall of the first molding compound.

15 Claims, 6 Drawing Sheets

Related U.S. Application Data

(60) Provisional application No. 62/237,250, filed on Oct. 5, 2015, provisional application No. 62/237,226, filed on Oct. 5, 2015.

(51) Int. Cl.
*H01L 23/00* (2006.01)
*H01L 23/498* (2006.01)
*H01L 21/56* (2006.01)

(52) U.S. Cl.
CPC .............. *H01L 24/19* (2013.01); *H01L 24/20* (2013.01); *H01L 24/94* (2013.01); *H01L 21/568* (2013.01); *H01L 23/3135* (2013.01); *H01L 2224/02379* (2013.01); *H01L 2224/04105* (2013.01); *H01L 2224/12105* (2013.01); *H01L 2224/19* (2013.01); *H01L 2224/32145* (2013.01); *H01L 2224/32225* (2013.01); *H01L 2224/73267* (2013.01); *H01L 2224/83005* (2013.01); *H01L 2224/92244* (2013.01); *H01L 2224/94* (2013.01); *H01L 2924/1431* (2013.01); *H01L 2924/1432* (2013.01); *H01L 2924/1436* (2013.01); *H01L 2924/19011* (2013.01); *H01L 2924/35121* (2013.01); *H01L 2924/37001* (2013.01)

(58) Field of Classification Search
CPC ....... H01L 23/5389; H01L 2224/83005; H01L 2224/19; H01L 2924/37001; H01L 2924/1436; H01L 2224/04105; H01L 2224/32225; H01L 2924/1432; H01L 2924/1431; H01L 23/3135; H01L 2224/94; H01L 2224/92244; H01L 2224/02379; H01L 2924/19011; H01L 2924/35121; H01L 2224/12105; H01L 21/568; H01L 2224/32145; H01L 2224/73267

See application file for complete search history.

(56) References Cited

U.S. PATENT DOCUMENTS

| | | | |
|---|---|---|---|
| 2007/0158857 A1 | 7/2007 | Mihara | |
| 2007/0262436 A1 | 11/2007 | Kweon et al. | |
| 2009/0014858 A1 | 1/2009 | Boon et al. | |
| 2009/0014876 A1* | 1/2009 | Youn | H01L 21/6835 257/738 |
| 2010/0178731 A1 | 7/2010 | Mihara | |
| 2011/0147911 A1* | 6/2011 | Kohl | H01L 21/6835 257/686 |
| 2012/0056329 A1 | 3/2012 | Pagaila | |
| 2013/0040423 A1 | 2/2013 | Tung et al. | |
| 2013/0168849 A1 | 7/2013 | Scanlan | |
| 2013/0341784 A1 | 12/2013 | Lin et al. | |
| 2014/0015145 A1* | 1/2014 | Cho | H01L 23/5226 257/774 |
| 2014/0042600 A1 | 2/2014 | Kim et al. | |
| 2014/0124960 A1 | 5/2014 | Boon et al. | |
| 2014/0131858 A1 | 5/2014 | Pan et al. | |
| 2014/0264817 A1 | 9/2014 | Lee et al. | |
| 2015/0262877 A1 | 9/2015 | Kurita et al. | |
| 2015/0303174 A1* | 10/2015 | Yu | H01L 25/0657 257/712 |
| 2016/0013156 A1* | 1/2016 | Zhai | H01L 25/0657 257/777 |
| 2016/0148904 A1* | 5/2016 | Zhai | H01L 21/4853 257/777 |
| 2016/0260684 A1* | 9/2016 | Zhai | H01L 25/0652 |
| 2016/0276307 A1 | 9/2016 | Lin | |
| 2016/0300813 A1* | 10/2016 | Zhai | H01L 21/561 |
| 2016/0300817 A1* | 10/2016 | Do | H01L 25/50 |
| 2016/0307872 A1* | 10/2016 | Chen | H01L 21/4857 |
| 2016/0315071 A1* | 10/2016 | Zhai | H01L 23/3128 |
| 2016/0329299 A1 | 11/2016 | Lin et al. | |
| 2017/0098629 A1* | 4/2017 | Liu | H01L 24/20 |
| 2018/0122764 A1* | 5/2018 | Chen | H01L 24/16 |

* cited by examiner

STACKED FAN-OUT PACKAGE STRUCTURE

CROSS REFERENCE TO RELATED APPLICATIONS

This Application is a Continuation of U.S. application Ser. No. 15/218,379, filed Jul. 25, 2016, entitled "STACKED FAN-OUT PACKAGE STRUCTURE", which claims priority to U.S. Provisional Application Ser. No. 62/237,250, filed Oct. 5, 2015 and U.S. Provisional Application Ser. No. 62/237,226, filed Oct. 5, 2015, each of which is hereby incorporated by reference in its entirety.

BACKGROUND OF THE INVENTION

Field of the Invention

The present invention relates to a semiconductor package structure, and in particular to a stacked fan-out package structure with high reliability.

Description of the Related Art

In recent years, as electronic products have been become increasingly multifunctional and have been scaled down in size, there is a desire for manufactures of semiconductor devices to make more devices formed on a single semiconductor wafer, so that the electronic products including these devices can be made more compact. Responses to this desire have been the development of the Package-on-package (POP) technique and wafer level package (WLP) technique. The PoP technique enables two or more packages to be installed atop one another, i.e. stacked, with a standard interface to route signals between them. This allows higher component density in electronic products, such as mobile phones, personal digital assistants (PDAs), and digital cameras. Moreover, in the WLP, the dies may be same size as the package.

However, some problems may occur while manufacturing the semiconductor package utilizing the PoP and/or WLP techniques. For example, in such a semiconductor package, the sidewall/edge of the redistribution layer (RDL) structure (which is sometimes referred to as the interconnect layer structure) between adjacent stacked packages is exposed to exterior environment. As a result, the RDL structure may be damaged easily due to poor moisture resistance. Moreover, after performing a dicing process to produce individual package structures, delamination may occur between the semiconductor die and the RDL structure or between the molding compound and the RDL structure so that reliability, yield, and throughput of the semiconductor package structure are reduced.

BRIEF SUMMARY OF THE INVENTION

Semiconductor package structures are provided. An exemplary embodiment of a semiconductor package structure includes a first semiconductor die having a first surface and a second surface opposite thereto. A first molding compound surrounds the first semiconductor die. A first RDL structure is disposed on the second surface of the first semiconductor die and laterally extends on the first molding compound. A second semiconductor die is disposed on the first RDL structure and has a first surface and a second surface opposite thereto. A second molding compound surrounds the second semiconductor die. A first protective layer covers a sidewall of the first RDL structure and a sidewall of the first molding compound.

Another exemplary embodiment of a semiconductor package structure includes a first semiconductor die having a first surface and a second surface opposite thereto. A first RDL structure is disposed on the second surface of the first semiconductor die. A second semiconductor die is disposed on the first RDL structure and has a first surface and a second surface opposite thereto. The second semiconductor die has smaller dimensions than the first semiconductor die, so that a portion of the first RDL structure is exposed from the second semiconductor die. A second molding compound is disposed on the exposed portion of the first RDL structure and surrounds the second semiconductor die. The second molding compound has an extending portion coveting a sidewall of the first RDL structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
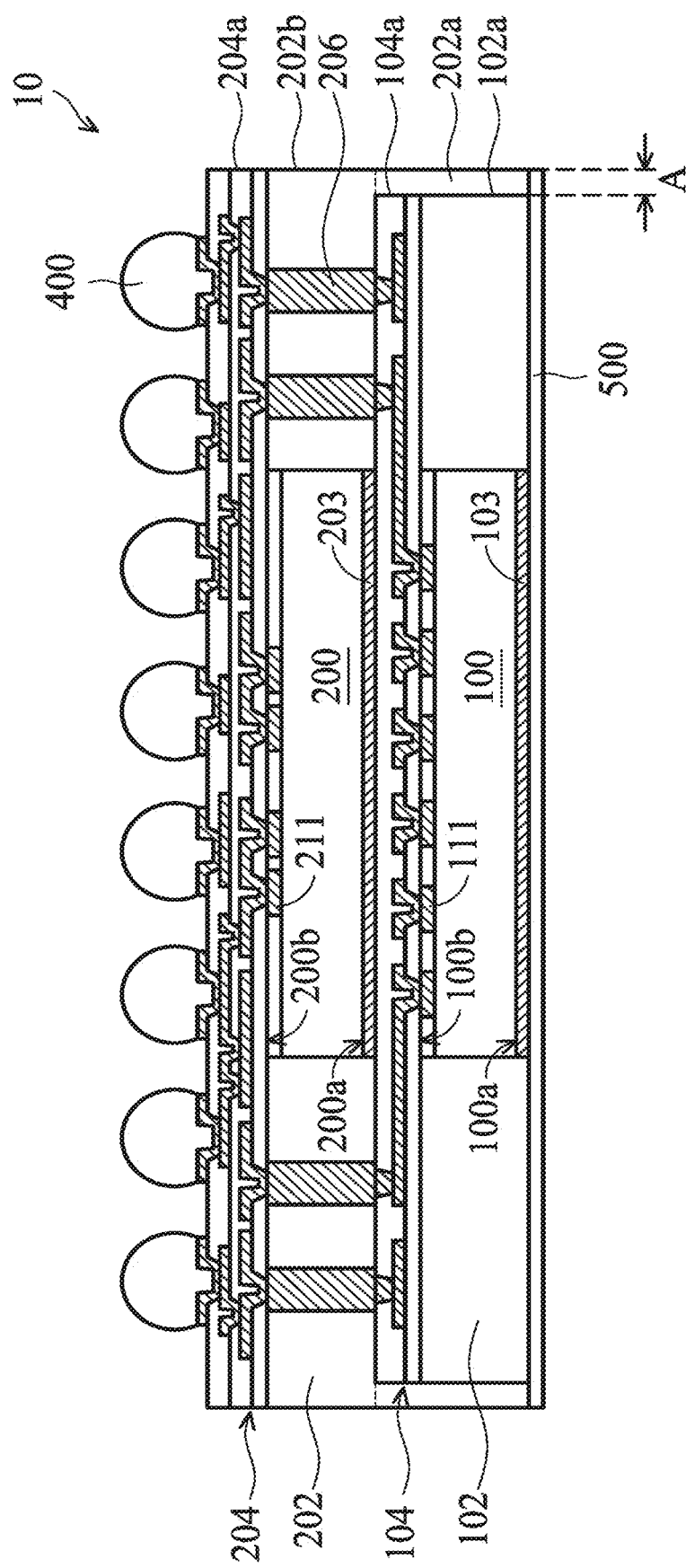
FIG. 1 is a cross-sectional view of a semiconductor package structure in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a cross-sectional view of a semiconductor package structure 10 in accordance with some embodiments of the disclosure. In some embodiments, the semiconductor package structure 10 is a wafer-level semiconductor package structure, for example, a stacked fan-out wafer-level semiconductor package structure. In one embodiment, the stacked fan-out wafer-level semiconductor package structure may include a system-on-chip (SOC) package structured a dynamic random access memory (DRAM) package structure vertically stacked thereon.

Referring to FIG. 1, the semiconductor package structure 10 may be mounted on a base (not shown), such as a printed circuit board (PCB), that is formed of polypropylene (PP). In some embodiments, the base serves as a package substrate and may be a single layer or a multilayer structure. Conductive pads and conductive traces electrically coupled thereto are typically disposed on the top surface of the base and/or in the base 600. In this case, the conductive aces may be used for the input/output (I/O) connections of the semiconductor package structure 10. In one embodiment, the semiconductor package structure 10 is mounted directly on the conductive traces.

In the embodiment, the semiconductor package structure 10 includes a first semiconductor die 100. The first semiconductor die 100 has a first surface 100a and a second surface 100b opposite thereto. Moreover, the first semiconductor die 100 may include conductive pads 111 that are electrically connected to the circuitry (not shown) of the first semiconductor die 100. In some embodiments, the first semiconductor die 100 (such as a SOC die) may include a logic die including a central processing unit (CPU), a graphics processing unit (GPU), a dynamic random access memory (DRAM) controller or any combination thereof. Alternatively, the first semiconductor die 100 may include a modem die.

In the embodiment, the semiconductor package structure 10 further includes a first molding compound 102 surrounding the first semiconductor die 100. The first and second surfaces 100a and 100b of the first semiconductor die 100 are exposed from the first molding compound 102. In some embodiments, the first molding compound 102 may be formed of an epoxy, a resin, a moldable polymer, or the like. The first molding compound 102 may be applied while substantially liquid, and then may be cured through a chemical reaction, such as in an epoxy or resin. In some other embodiments, the first molding compound 102 may be an ultraviolet (UV) or thermally cured polymer applied as a gel or malleable solid capable of being disposed around the first semiconductor die 100, and then may be cured through a UV or thermal curing process. The first molding compound 102 may be cured with a mold (not shown).

In the embodiment, the semiconductor package structure 10 further includes a first RDL structure 104 disposed on the second surface 100b of the first semiconductor die 100 and laterally extending on the first molding compound 102. In some embodiments, the first RDL structure 104, which is also referred to as a fan-out structure, has a sidewall 104a that is substantially and vertically aligned with the corresponding sidewall 102a of the first molding compound 102. The first RDL structure 104 is connected to the first semiconductor die 100 through the conductive pads 111.

In the embodiment, the first RDL structure 104 includes one or more conductive traces disposed in an inter-metal dielectric (IMD) layer. The conductive traces are electrically coupled to the conductive pads 111 of the first semiconductor die 100. In some embodiments, the IMI) layer is formed of an organic material, which includes a polymer base material (such as polybenzoxazole (PBO) or polyimide) or the like. For example, the IMD layer is made of a photo-sensitive material, which includes a dry film photoresist, or a taping film.

In the embodiment, the semiconductor package structure 10 further includes a bottom protective layer 500 (which is sometimes referred to as a backside film (BSF)) disposed on the first surface 100a of the first semiconductor die 100 via an adhesion layer 103, which is sometimes referred to as a die-attach film (DAF) and is used for attaching the first semiconductor die 100 onto a carrier (not shown) during fabrication of the semiconductor package structure 10. Namely, the adhesion layer 103 is disposed between the bottom protective layer 500 and the first semiconductor die 100. In some embodiments, the adhesion layer 103 has sidewalls that are substantially aligned with sidewalls of the first semiconductor die 100, so that the adhesion layer 103 and the first semiconductor die 100 substantially have the same width, as shown in FIG. 1, Alternatively, the adhesion layer 103 has sidewalls that are substantially aligned with sidewalk of the bottom protective layer 500, so that the adhesion layer 103 and the bottom protective layer 500 substantially have the same width.

Moreover, the backside film 500 is also disposed on the first molding compound 102. The backside film protects the first semiconductor die 100 and the first molding compound 102 from being damaged.

In the embodiment, the semiconductor package structure 10 further includes a second semiconductor die 200 disposed on the first RDL structure 104. In the embodiment, the second semiconductor die 200 has a first surface 200a and a second surface 200b opposite thereto. Moreover, the second semiconductor die 200 may include conductive pads 211 that are electrically connected to the circuitry (not shown) of the second semiconductor die 200. In some embodiments, the second semiconductor die 200 may include a DRAM die. Alternatively, the second semiconductor die 200 may include an integrated passive device (IPD) die. In the embodiment, the first surface 200a of the second semiconductor die 200 is attached onto the first RDL, structure 104 via an adhesion layer 203, such as a DAF. The adhesion layer 203 may include a material that is the same or similar to that of the adhesion layer 103. Similarly, the adhesion layer 203 has sidewalls that are substantially aligned with sidewalls of the second semiconductor die 200, so that the adhesion layer 203 and the second semiconductor die 200 substantially have the same width, as shown in FIG. 1.

In the embodiment, the semiconductor package structure 10 further includes a second molding compound 202 surrounding the second semiconductor die 200. The first and second surfaces 200a and 200b of the second semiconductor die 200 are exposed from the second molding compound 202. In some embodiments, the second molding compound 202 is formed of a material that is the same as or similar to that of the first molding compound 102. In some embodiments, the second molding compound 202 includes one or more through vias 206 (which are sometimes referred to as through package vias (TPVs) or through interposer vias (TIVs)) passing through the second molding compound 202 and electrically coupled to the first RDL structure 104 by the conductive traces in the first RDL structure 104. In some embodiments, the second semiconductor die 200 may be surrounded by the through vias 206. Moreover, the through vias 206 may be formed of copper.

In the embodiment, the semiconductor package structure 10 further includes a first protective layer covering a sidewall 104a of the first RDL structure 104 and a sidewall 102a of the first molding compound 102 to serve as sidewall protection. For example, the first protective layer is an extending portion 202a of the second molding compound 202. In this case, the extending portion 202a conformally extends along the sidewalls 104a and 102a to the bottom protective layer 500, thereby entirely covering the sidewalls 104a and 102a. Moreover, the extending portion 202a may have a width A in a range of about 0.1 mm to 10 mm.

In the embodiment, the semiconductor package structure 10 further includes a second RDL structure 204 disposed on the second surface 200b of the second semiconductor die 200 and laterally extending on the second molding compound 202. In some embodiments, the second RDL structure 204, which is also referred to as a fan-out structure, has a sidewall 204a that is substantially and vertically aligned with the corresponding sidewall 202b of the second molding compound 202, but is not vertically aligned with the sidewall 104a of the first RDL structure 104. For example, the second RDL structure 204 laterally extends beyond the first RDL structure 104. In the embodiment, the second RDL structure 204 is connected to the second semiconductor die 200 through the conductive pads 211. In the embodiment, the second RDL structure 204 is similar to the first RDL structure 104 and includes one or more conductive traces disposed in an IMD layer. The conductive traces are electrically coupled to the conductive pads 211 of the second semiconductor die 200. Moreover, the conductive traces are electrically coupled to the through vias 206 in the second molding compound 202, so that the through vias 206 are electrically coupled between the first RDL structure 104 and the second RDL structure 204.

In the embodiment, the semiconductor package structure 10 further includes bumps 400 disposed on and electrically coupled to the second RDL structure 204. In some embodiments, the bumps 400 may be copper or solder bumps. Alternatively, the bumps 400 include conductive balls, conductive pillars, or conductive paste structures.

According to the foregoing embodiment, since the sidewall of the RDL structure between adjacent stacked semiconductor dies is covered by the protective layer to serve as sidewall protection, the damage to this RDL structure due to poor moisture resistance can be prevented. Moreover, since the protective layer for sidewall protection is an extending portion of the molding compound that is disposed on the protected RDL structure, there is no need to perform any additional process for formation of the protective layer, and the delamination between the semiconductor die and the RDL structure or between the molding compound and the RDL structure can be prevented. As a result, reliability, yield, and throughput of the semiconductor package structure are increased.

Figure 2:
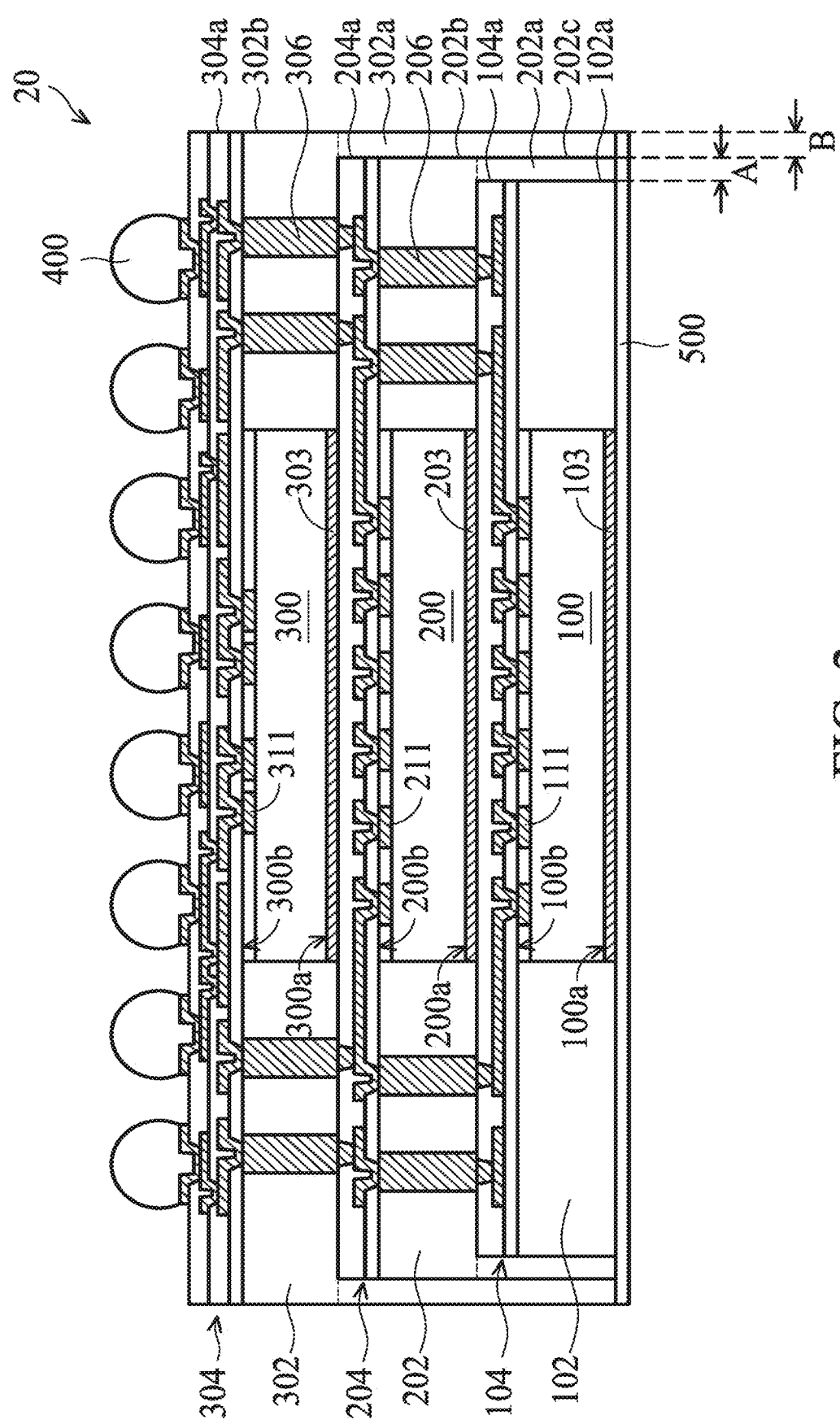
FIG. 2 is a cross-sectional view of a semiconductor package structure in accordance with some embodiments of the disclosure.

FIG. 2 is a cross-sectional view of a semiconductor package structure 20 in accordance with some embodiments of the disclosure. Descriptions of elements of the embodiments hereinafter that are the same as or similar to those previously described with reference to FIG. 1 may be omitted for brevity. In the embodiment, the semiconductor package structure 20 is similar to the semiconductor package structure 10 shown in FIG. 1. Compared to the semiconductor package structure 10, the package structure 20 further includes a third semiconductor die 300 disposed on the second. RDL structure 204. In the embodiment, the third semiconductor die 300 has a first surface 300a and a second surface 300b opposite thereto. Moreover, the third semiconductor die 300 may include conductive pads 311 that are electrically connected to the circuitry (not shown) of the third semiconductor die 300. In some embodiments, the third semiconductor die 300 may include a logic die (which includes a CPU, a GPU, or a memory controller), a modern chip, or passive devices. In the embodiment, the first surface 300a of the third semiconductor die 300 is attached onto the second RDL structure 204 via an adhesion layer 303, such as a DAF. The adhesion layer 303 may include a material that is the same or similar to that of the adhesion layer 103. Similarly, the adhesion layer 303 has sidewalls that are substantially aligned with sidewalls of the third semiconductor die 300, so that the adhesion layer 303 and the third semiconductor die 300 substantially have the same width, as shown in FIG. 2.

Compared to the semiconductor package structure 10, in the embodiment, the semiconductor package structure 20 further includes a third molding compound 302 surrounding the third semiconductor die 300. The first and second surfaces 300a and 300b of the third semiconductor die 300 are exposed from the third molding compound 302. In some embodiments, the third molding compound 302 is formed of a material that is the same as or similar to that of the first molding compound 102 or the second molding compound 202. In some embodiments, the third molding compound 302 includes one or more through vias 306 (which are sometimes referred to as TPVs or TIVs) passing through the third molding compound 302 and electrically coupled to the second RDL structure 204 by the conductive traces in second RDL structure 204. In some embodiments, the third semiconductor die 300 may be surrounded by the through vias 306. Moreover, the through vias 306 may be formed of copper.

Compared to the semiconductor package structure 10, in the embodiment, the semiconductor package structure 20 further includes a second protective layer covering a sidewall 204a of the second RDL structure 204, a sidewall 202b of the second molding compound 202, and a sidewall 202c of the first protective layer 202a to serve as another sidewall protection. For example, the second protective layer is an extending portion 302a of the third molding compound 302. In this case, the extending portion 302a conformally extends along the sidewalls 204a, 202b, and 202c to the bottom protective layer 500, thereby entirely covering the sidewalk 204a, 202b, and 202c. Moreover, the extending portion 302a may have a width B in a range of about 0.1 mm to 10 mm.

Compared to the semiconductor package structure 10, in the embodiment, the semiconductor package structure 20 further includes a third RDL structure 304 disposed on the second surface 300b of the third semiconductor die 300 and laterally extending on the third molding compound 302, In some embodiments, the third RDL structure 304, which is also referred to as a fan-out structure, has a sidewall 304a that is substantially and vertically aligned with the corresponding sidewall 302b of the third molding compound 302, but is not vertically aligned with the sidewall 204a of the second RDL structure 204 or the sidewall 104a of the first RDL structure 104. For example, the third RDL structure 304 laterally extends beyond the second RDL structure 204, and the second RDL structure 204 laterally extends beyond the first RDL structure 104. In the embodiment, the third RDL structure 304 is connected to the third semiconductor die 300 through the conductive pads 311. In the embodiment, the third RDL structure 304 is similar to the first RDL structure 104 or the second RDL structure 204 and includes one or more conductive traces disposed in an IMD layer. The conductive traces are electrically coupled to the conductive pads 311 of the third semiconductor die 300. Moreover, the conductive traces are electrically coupled to the through vias 306 in the third molding compound 302, so that the through vias 306 electrically coupled between the second RDL structure 204 and third RDL structure 304.

In the embodiment, the bumps 400 in the semiconductor package structure 20 are disposed on and electrically coupled to the third RDL structure 304.

According to the foregoing embodiment, since the sidewalls of the RDL structures between adjacent stacked semiconductor dies are covered by two protective layers to serve as sidewall protection, damage to the RDL structures due to poor moisture resistance can be prevented. Moreover, since the protective layers for sidewall protection are an extending portion of the corresponding molding compound, there is no need to perform any additional process for formation of these protective layers, and the delamination between the semiconductor die and the overlying RDL, structure or between the molding compound and the overlying RDL structure can be prevented. As a result, reliability, yield, and throughput of the semiconductor package structure are increased.

Figure 3:
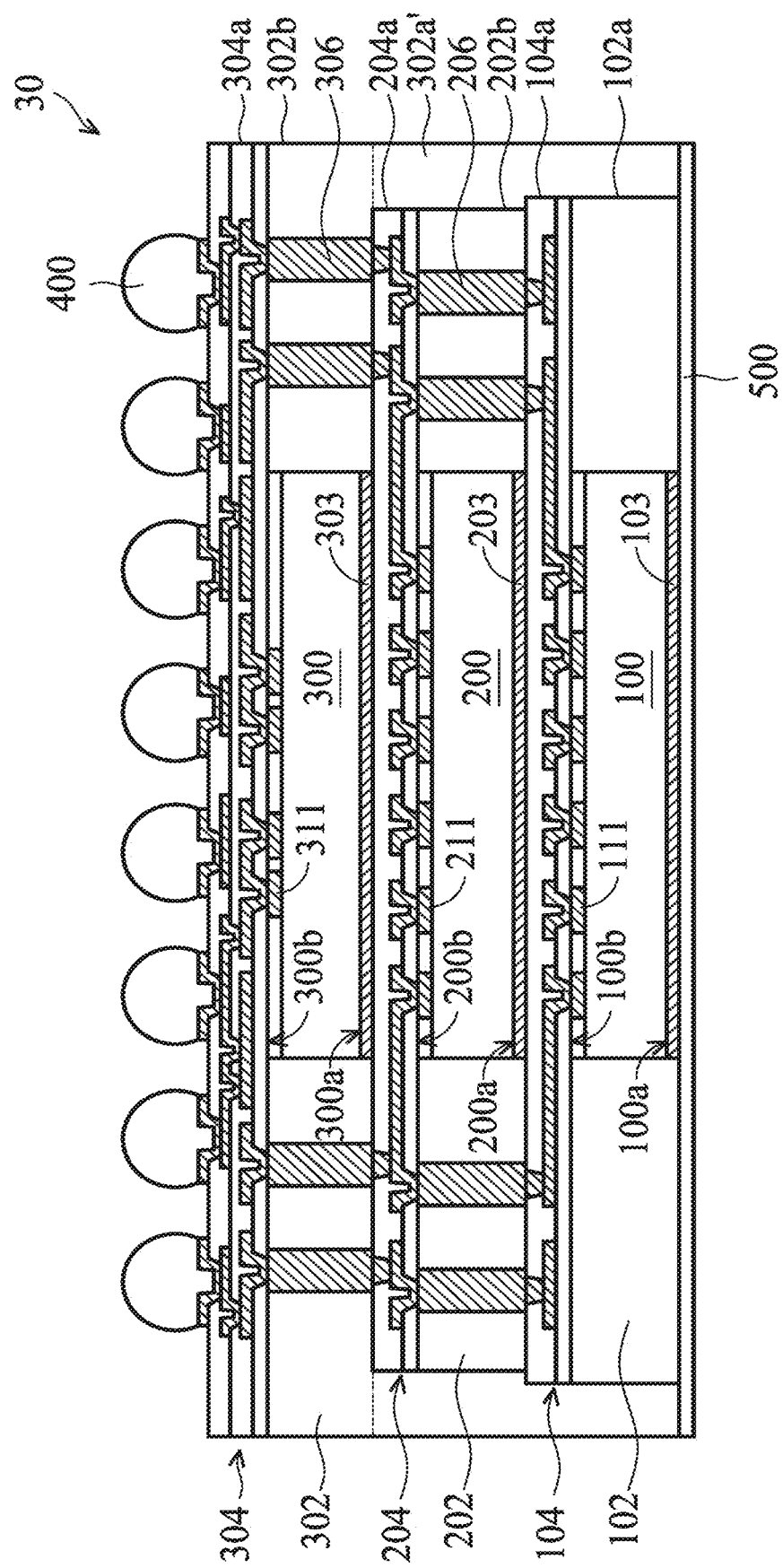
FIG. 3 is a cross-sectional view of a semiconductor package structure in accordance with some embodiments of the disclosure.

FIG. 3 is a cross-sectional view of a semiconductor package structure 30 in accordance with some embodiments of the disclosure. Descriptions of elements of the embodiments hereinafter that are the same as or similar to those previously described with reference to FIGS. 1 and 2 may be omitted for brevity. In the embodiment, the semiconductor package structure 30 is similar to the semiconductor package structure 20 shown in FIG. 2. Unlike the semiconductor package structure 20, in the embodiment, the first protective layer covers a sidewall 204a of the second RDL structure 204, a sidewall 202b of the second molding compound 202, a sidewall 104a of the first RDL structure 104, and a sidewall 102a of the first molding compound 102 to serve as sidewall protection. For example, the first protective layer is an extending portion 302a' of the third molding compound 302. In this case, the extending portion 302a' extends along the sidewalk 204a, 202b, 104a, and 102a to the bottom protective layer 500, thereby entirely covering the sidewalls 204a, 202b, 104a, and 102a. In some embodiments, the sidewall 304a of the third RDL structure 304 is not vertically aligned with the sidewall 204a of the second RDL structure 204 or the sidewall 104a of the first RDL structure 104. For example, the third RDL structure 304 and the first RDL structure 104 laterally extend beyond the second RDL structure 204, respectively. Moreover, the third RDL structure 304 laterally extends beyond the first RDL structure 104.

According to the foregoing embodiment, since the sidewalls of the RDL, structures between adjacent stacked semiconductor dies are covered by the protective layer to serve as sidewall protection, damage to the RDL structures due to poor moisture resistance can be prevented. Moreover, since the protective layer for sidewall protection are an extending portion of the uppermost molding compound, there is no need to perform any additional process for formation of the protective layer, and the delamination between the semiconductor die and the overlying RDL structure or between the molding compound and the overlying RDL structure can be prevented. As a result, reliability, yield, and throughput of the semiconductor package structure are increased.

Figure 4:
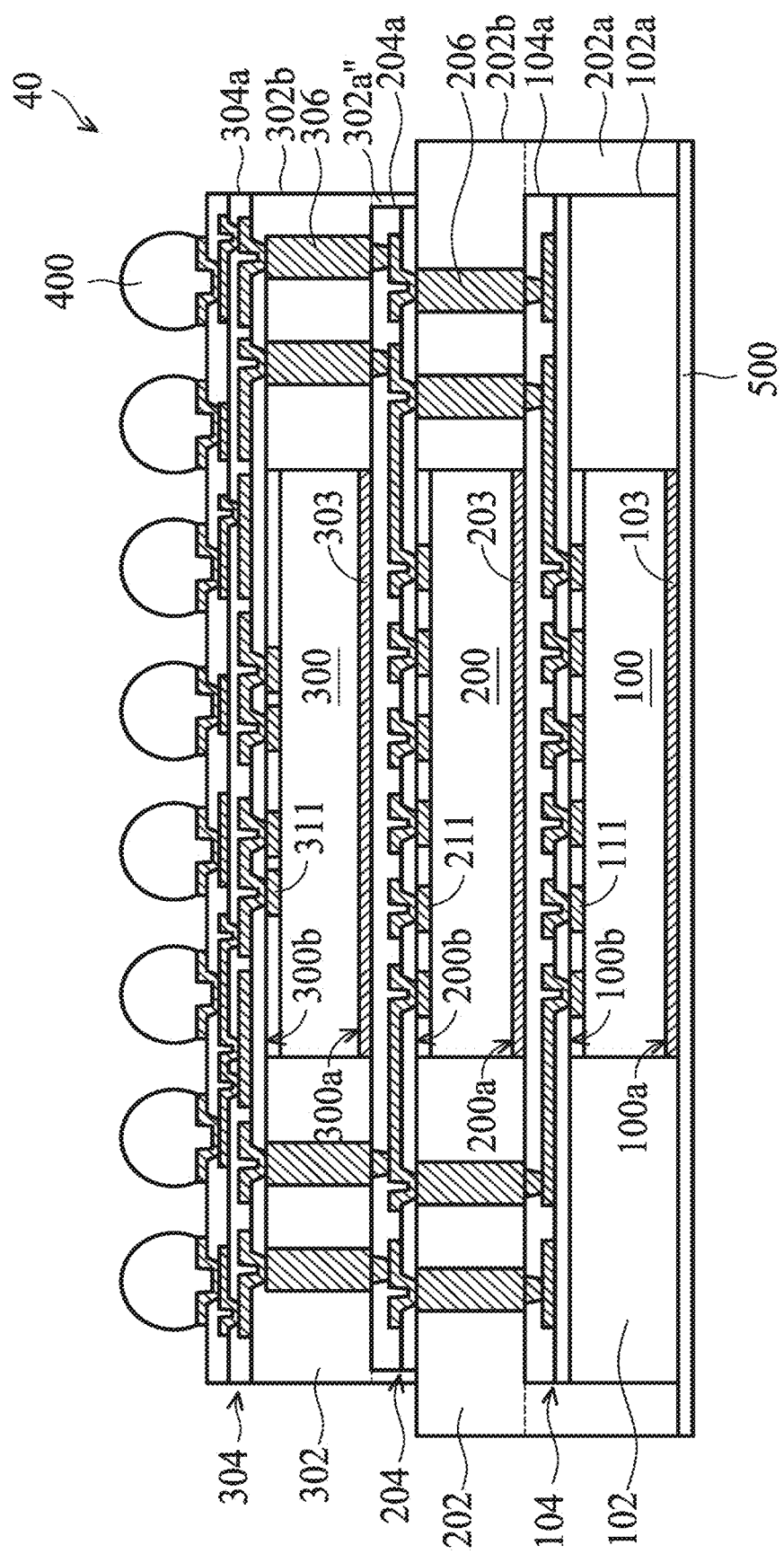
FIG. 4 is a cross-sectional view of a semiconductor package structure in accordance with some embodiments of the disclosure.

FIG. 4 is a cross-sectional view of a semiconductor package structure 40 in accordance with some embodiments of the disclosure. Descriptions of elements of the embodiments hereinafter that are the same as or similar to those previously described with reference to FIGS. 1 and 2 may be omitted for brevity. In the embodiment, the semiconductor package structure 40 is similar to the semiconductor package structure 20 shown in FIG. 2. Unlike the semiconductor package structure 20, in the embodiment, the second protective layer merely covers a sidewall 204a of the second RDL structure 204 and is disposed on the second molding compound 202, so that a sidewall 202b of the second molding compound 202 and a sidewall 202c of the extending portion 202a of the second molding compound 202 are exposed from the second protective layer. For example, the second protective layer is an extending portion 302a" of the third molding compound 302. In this case, the extending portion 302a" extends along the sidewall 204a to the second molding compound 202, thereby entirely covering the sidewall 204a. In some embodiments, the sidewall 302b of the third molding compound 302 may be not vertically aligned with the sidewall 202b of the second molding compound 202, as shown in FIG. 4. Alternatively, the sidewall 302b of the third molding compound 302 may be substantially and vertically aligned with the sidewall 202b of the second molding compound 202. In some embodiments, the sidewall 304a of the third RDL structure 304 is not vertically aligned with the sidewall 204a of the second RDL, structure 204 or the sidewall 104a of the first RDL structure 104. For example, the third RDL structure 304 and the first RDL structure 104 laterally extend beyond the second RDL structure 204, respectively. Moreover, the third. RDL structure 304 may or may not laterally extend beyond the first RDL structure 104.

According to the foregoing embodiment, since the sidewalls of the RDL, structures between adjacent stacked semiconductor dies are covered by different protective layers to serve as sidewall protection, damage to the RDL structures due to poor moisture resistance can be prevented. Moreover, since the protective layers for sidewall protection are an extending portion of a corresponding molding compound, there is no need to perform any additional process for formation of these protective layers, and the delamination between the semiconductor die and the overlying RDL structure or between the molding compound and the overlying RDL structure can be prevented. As a result, reliability, yield, and throughput of the semiconductor package structure are increased.

Figure 5:
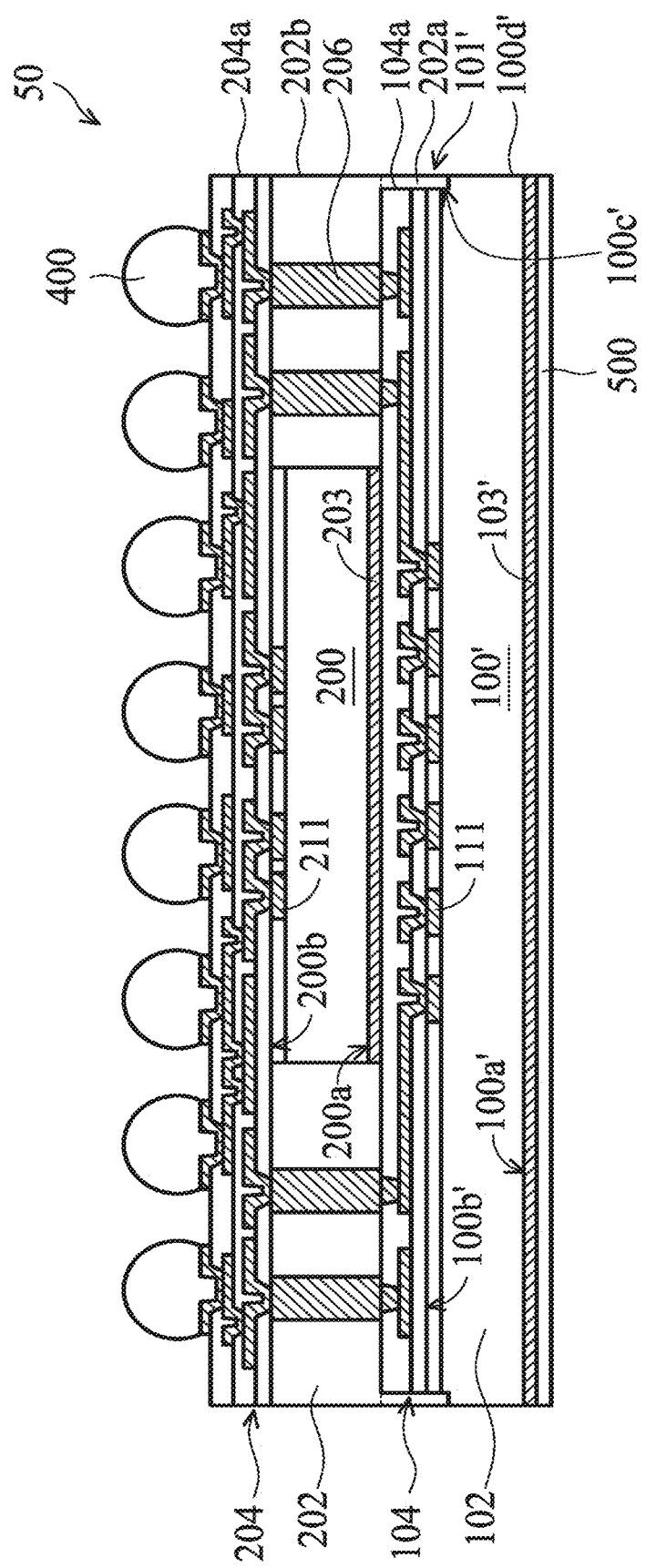
FIG. 5 is a cross-sectional view of a semiconductor package structure in accordance with some embodiments of the disclosure.

FIG. 5 is a cross-sectional view of a semiconductor package structure 50 in accordance with some embodiments of the disclosure. Descriptions of elements of the embodiments hereinafter that are the same as or similar to those previously described with reference to FIG. 1 may be omitted for brevity. In the embodiment, the semiconductor package structure 50 is similar to the semiconductor package structure 10 shown in FIG. 1, except the first semiconductor die 100' and the first protective layer. In the embodiment, the first semiconductor die 100' has a first surface 100a' and a second surface 100b' opposite thereto, and has different dimensions than the second semiconductor die 200. For example, the second semiconductor die 200 has smaller dimensions than the first semiconductor die 100'. In this case, the first semiconductor die 100' may serve as a carrier substrate for the second semiconductor die 200. Accordingly, the first RDL structure 104 disposed on the first semiconductor die 100' does not serve as a fan-out layer for the first semiconductor die 100'.

In the embodiment, the first protective layer covers a sidewall 104a of the first RDL structure 104 and fills an opening 101' that is formed at the edge of the first semiconductor die 100', so as to cover a sidewall 100c' of opening 101'. The first protective layer serves as sidewall protection. For example, the first protective layer is an extending portion 202a of the second molding compound 202. In this case, the extending portion 202a entirely covers the sidewall 104a of the first RDL structure 104 and partially exposes the sidewall 100d' of the first semiconductor die 100'. In the embodiment, the bottom protective layer 500 disposed on the first surface 100a' of the first semiconductor die 100' via an adhesion layer 103', which is sometimes referred to as a DAF and is used for attaching the first semiconductor die 100' onto a carrier (not shown) during fabrication of the semiconductor package structure 50. Similarly, the adhesion layer 103' has sidewalls that are substantially aligned with lower sidewalls of the first semiconductor die 100' and sidewalls of the bottom protective layer 500, so that the adhesion layer 103' and the bottom protective layer 500 substantially have the same width, as shown in FIG. 5.

Figure 6:
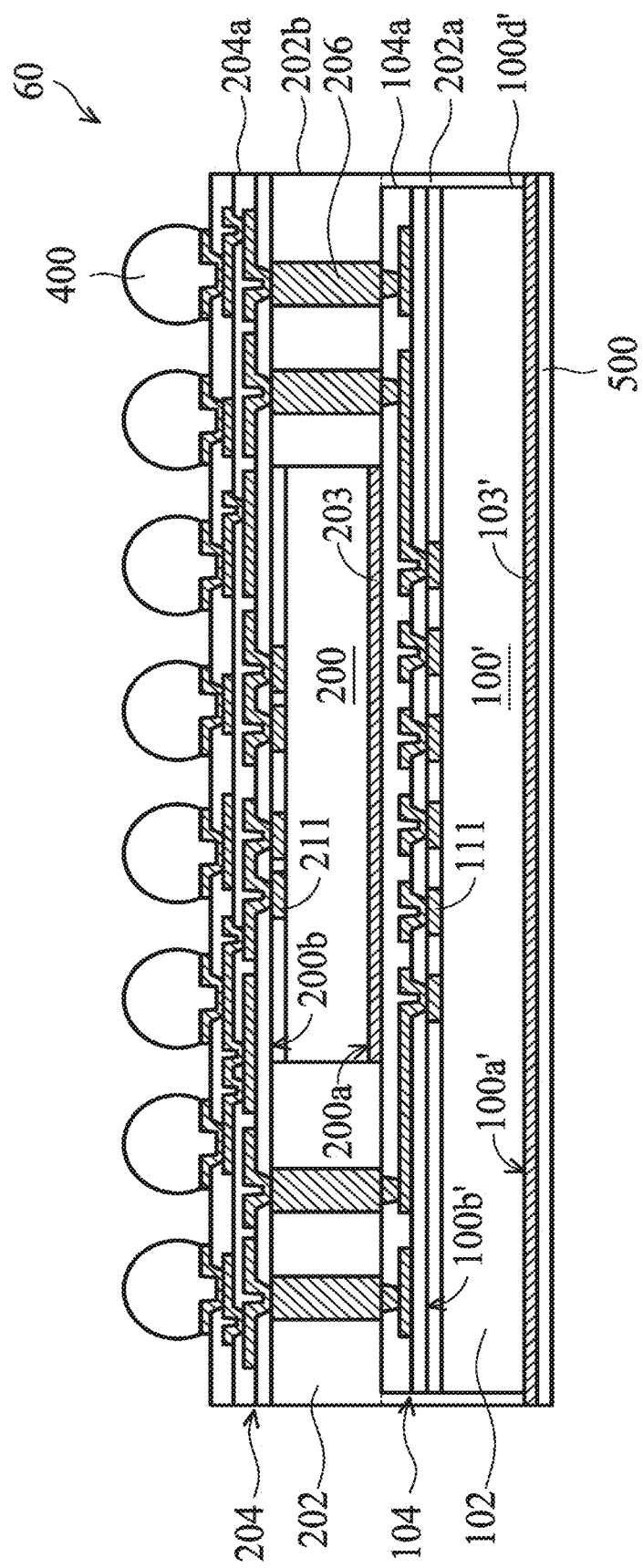
FIG. 6 is a cross-sectional view of a semiconductor package structure in accordance with some embodiments of the disclosure.

FIG. 6 is a cross-sectional view of a semiconductor package structure 60 in accordance with some embodiments of the disclosure. Descriptions of elements of the embodiments hereinafter that are the same as or similar to those previously described with reference to FIGS. 1 and 5 may be omitted for brevity. In the embodiment, the semiconductor package structure 60 is similar to the semiconductor package structure 50 shown in FIG. 5 except the first protective layer. In the embodiment, the first protective layer covers a sidewall 104a of the first RDL structure 104 and the sidewall 100d' of the first semiconductor die 100'. The first protective layer serves as sidewall protection. For example, the first protective layer is an extending portion 202a of the second molding compound 202. In this case, the extending portion 202a entirely covers the sidewalls 104a and 100d'.

According to the foregoing embodiments, since the first semiconductor die can serve as a carrier substrate for the overlying second semiconductor die, there is no need to form a molding compound to surround the first semiconductor die for supporting an overlying fan-out layer. As a result, the manufacturing cost can be reduced and the processes for the semiconductor package structure can be simplified.

Similarly, since the sidewall of the RDL structure between adjacent stacked semiconductor dies is covered by the protective layer to serve as sidewall protection, damage to this RDL structure due to poor moisture resistance can be prevented. Moreover, since the protective layer for sidewall protection is an extending portion of the molding compound that is disposed on the protected RDL structure, there is no need to perform any additional process for formation of the protective layer, and the delamination between the semiconductor die and the RDL structure or between the molding compound and the RDL structure can be prevented. As a result, reliability, yield, and throughput of the semiconductor package structure are increased.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
a first semiconductor die having a first surface and a second surface opposite thereto;
a film disposed on the first surface of the first semiconductor die via an adhesion layer;
a first molding compound surrounding the first semiconductor die and in contact with the film;
a first redistribution layer (RDL) structure disposed on the second surface of the first semiconductor die and laterally extending on the first molding compound;
a second semiconductor die disposed on the first RDL structure and having a first surface and a second surface opposite thereto;
a second molding compound surrounding the second semiconductor die and in contact with the film;
a third semiconductor die disposed on a second RDL structure and having a first surface and a second surface opposite thereto;
a third molding compound surrounding the third semiconductor die and in contact with the film; and
a third RDL structure disposed on the second surface of the third semiconductor die and laterally extending on the third molding compound,
wherein the first and second surfaces of the third semiconductor die are exposed from the third molding compound.

2. The semiconductor package structure of claim 1, wherein the first and second surfaces of the second semiconductor die are exposed from the second molding compound.

3. The semiconductor package structure of claim 1, wherein the second molding compound comprises an extending portion that covers a sidewall of the first molding compound.

4. The semiconductor package structure of claim 3, wherein the extending portion of the second molding compound has a width of between 0.1 mm to 10 mm.

5. The semiconductor package structure of claim 3, wherein the third molding compound comprises an extending portion that covers a sidewall of the second molding compound.

6. The semiconductor package structure of claim 5, wherein the extending portion of the third molding compound has a width of between 0.1 mm to 10 mm.

7. The semiconductor package structure of claim 1, wherein a sidewall of the second RDL structure is not vertically aligned with a sidewall of the first RDL structure.

8. The semiconductor package structure of claim 1, further comprising:
a plurality of bumps disposed on and electrically coupled to the second RDL structure; and
a plurality of through vias passing through the second molding compound and electrically coupled between the first RDL structure and the second RDL structure.

9. The semiconductor package structure of claim 1, wherein a sidewall of the third RDL structure is not vertically aligned with a sidewall of the first RDL structure or a sidewall of the second RDL structure.

10. The semiconductor package structure of claim 9, further comprising:
a plurality of bumps disposed on and electrically coupled to the third RDL structure; and
a plurality of through vias passing through the third molding compound and electrically coupled between the second RDL structure and the third RDL structure.

11. The semiconductor package structure of claim 1, wherein a sidewall of the second RDL structure is not vertically aligned with a sidewall of the first RDL structure.

12. The semiconductor package structure of claim 1, wherein the adhesion layer and the first semiconductor die have a same width along a first direction parallel to the first surface of the first semiconductor die.

13. The semiconductor package structure of claim 12, wherein a width of the first semiconductor die along the first direction is not greater than a width of the second semiconductor die along the first direction.

14. The semiconductor package structure of claim 13, wherein the width of the first semiconductor die equals the width of the second semiconductor die.

15. The semiconductor package structure of claim 1, further comprising one or more through vias disposed in the second molding compound, each through via electrically coupled to the first RDL structure and the second RDL structure, and is disposed outside a lateral extent of the first semiconductor die.

\* \* \* \* \*